United States Patent [19]
Chi

[11] Patent Number: 5,936,898
[45] Date of Patent: Aug. 10, 1999

[54] BIT-LINE VOLTAGE LIMITING ISOLATION CIRCUIT

[75] Inventor: Min-Hwa Chi, Hsinchu, Taiwan

[73] Assignee: Vanguard International Semiconductor Corporation, Hsin-Chu, Taiwan

[21] Appl. No.: 09/053,853

[22] Filed: Apr. 2, 1998

[51] Int. Cl.[6] ........................................................ G11C 7/00
[52] U.S. Cl. ............................ 365/190; 365/205; 365/207
[58] Field of Search ......................................... 365/190, 205, 365/207, 206, 149

[56] References Cited

U.S. PATENT DOCUMENTS

| | | | |
|---|---|---|---|
| 5,010,523 | 4/1991 | Yamauchi | 365/205 |
| 5,276,641 | 1/1994 | Sprogis et al. | 365/189.02 |
| 5,414,662 | 5/1995 | Foss et al. | 365/149 |
| 5,444,662 | 8/1995 | Tanaka et al. | 365/205 |
| 5,625,585 | 4/1997 | Ahn et al. | 365/63 |
| 5,636,170 | 6/1997 | Seyyedy | 365/205 |

OTHER PUBLICATIONS

Bellaovar et al. "Low Power digital VLSI design–circuits and systems", Kiuwer Academic, Chapter 6, sec. 6.2.13.1, p. 381–3, 1995.
Aoki et al. "A 60ns, 16Mb, CMOS DRAM with a transposed data–line structure" IEEE Trans. Solid–State Circuits, SC–23, No. 5, p. 1113, 1988.

*Primary Examiner*—Vu A. Le
*Attorney, Agent, or Firm*—George O. Saile; Stephen B. Ackerman; Billy J. Knowles

[57] ABSTRACT

A voltage limiting isolation circuit for pairs of bit lines within a row of DRAM cells to reduce noise coupling will selectively connect and disconnect the portions of a primary and a complementary bit lines, onto which DRAM cells are attached, from the portions of the primary and the complementary bit lines, onto which latching sense amplifier and pre-charge and equalization circuit are attached. The voltage limiting bit line isolation circuit has two sets of serially connected N-type MOS transistors and first P-type MOS transistors placed on the primary bit line and the complementary bit line. Isolation voltage control circuits will provide voltages to the gates of the N-type MOS transistors and P-type MOS transistors to activate and deactivate the voltage limiting isolation control circuit. During a read cycle the latching sense amplifier will sense and amplify the charge from a selected cell and begin to force the first and second portions of the primary and complementary bit lines to a voltage level that is either that of the power supply voltage source or the ground. As the voltage level of the first and second portions of the primary and complementary bit lines approaches to within one threshold voltage level of the MOS transistors, the voltage limiting bit line isolation circuit will deactivate. The first portions of the primary and complementary bit lines will swing to a lower voltage level thus lowering coupled noise to adjacent bit lines.

13 Claims, 5 Drawing Sheets

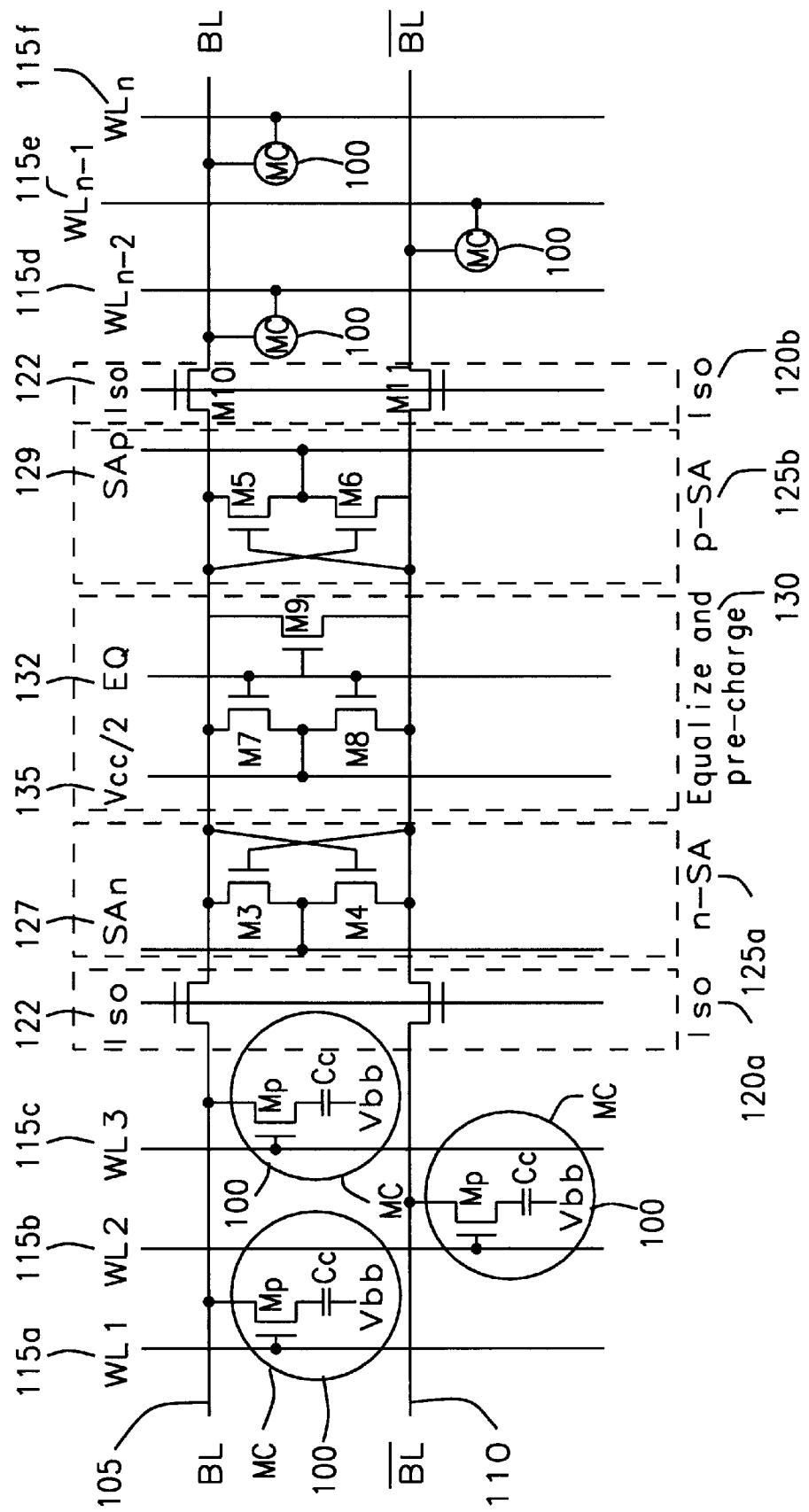
FIG. 1a – Prior Art

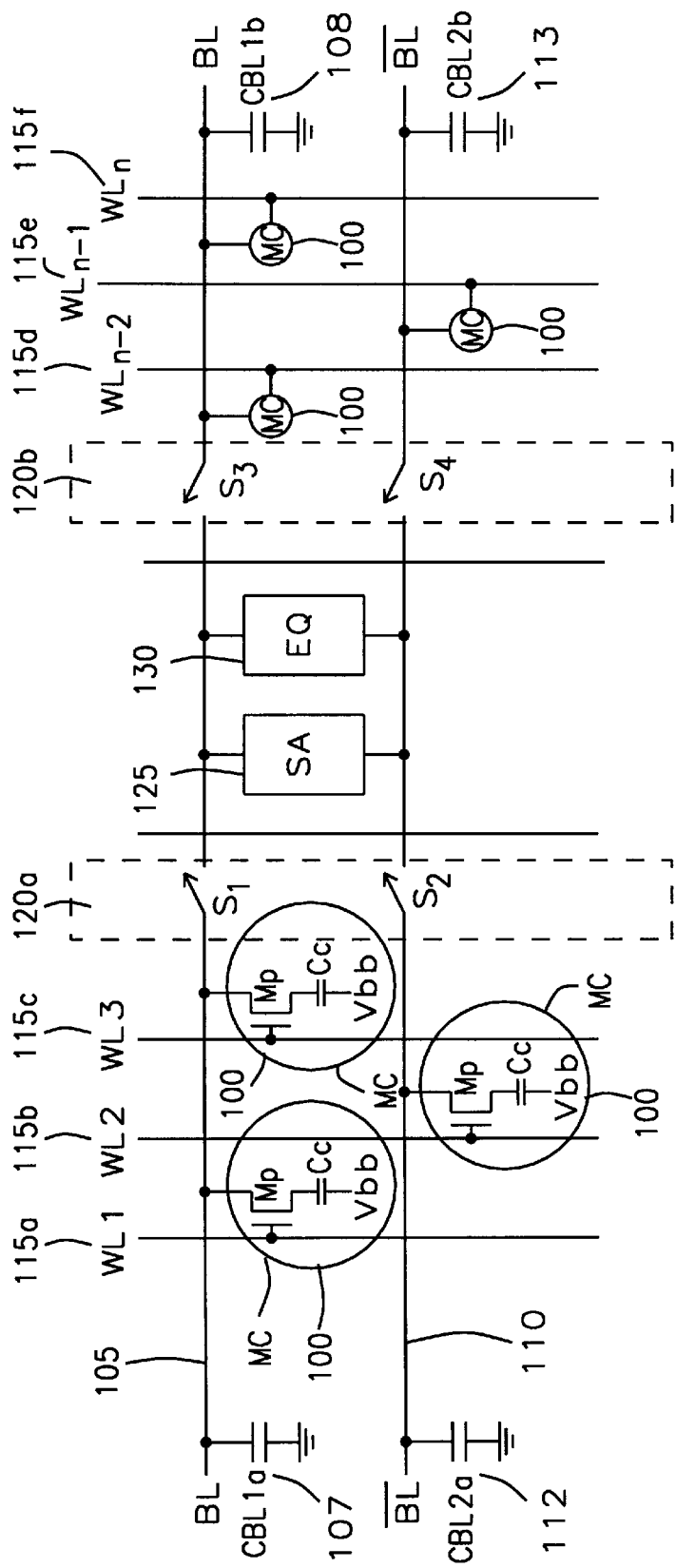
FIG. 1b – Prior Art

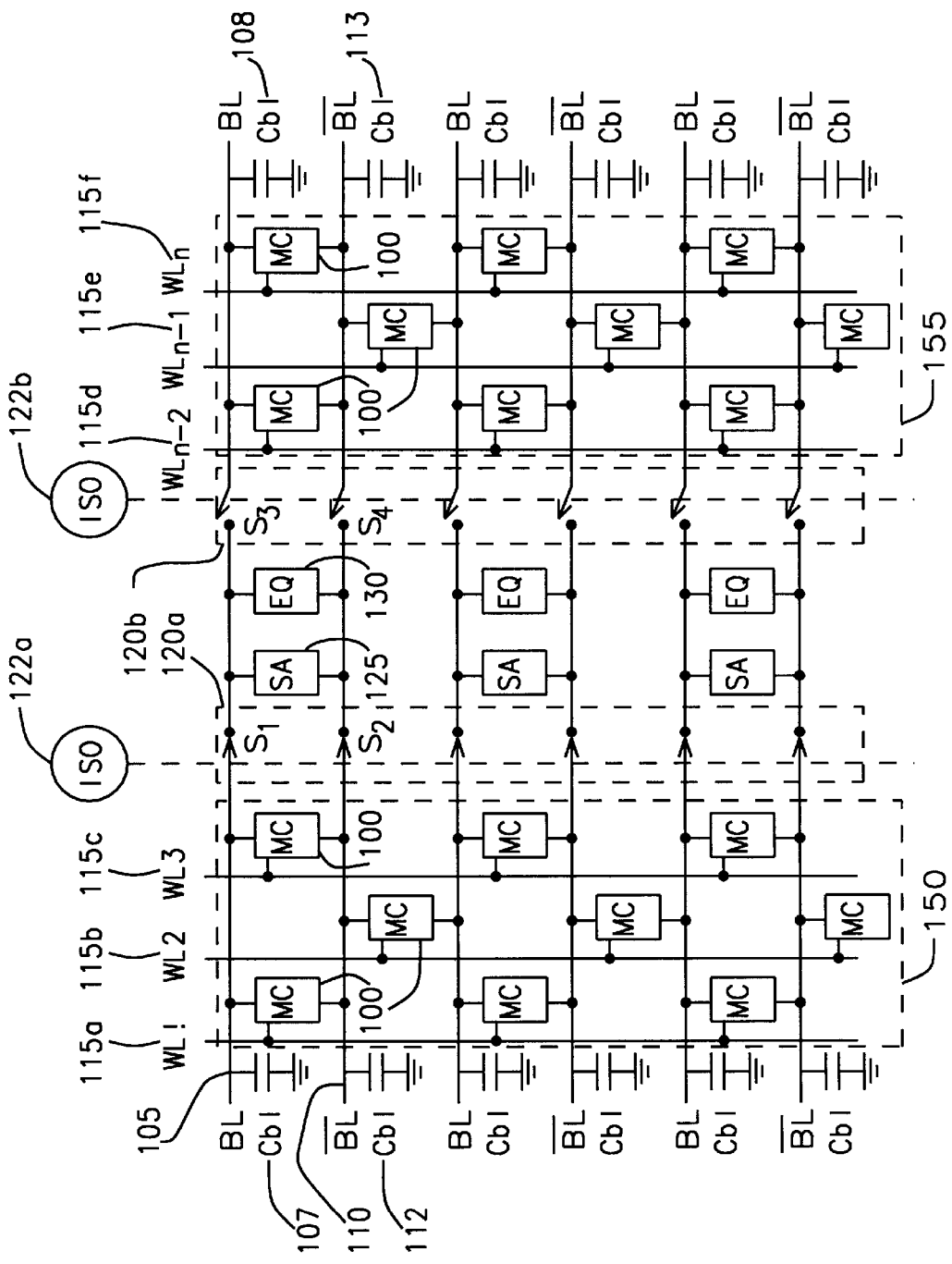
FIG. 2 – Prior Art

BIT-LINE VOLTAGE LIMITING ISOLATION CIRCUIT

BACKGROUND OF THE INVENTION

1. Field of the Invention

This invention relates to Dynamic Random Access Memories (DRAM) and more particularly to support circuitry to selectively isolate and connect DRAM cells in DRAM arrays for pre-charging bit lines and sensing the charge level representing digital data in a DRAM cell.

2. Description of Related Art

The sensing scheme of folded-bit-line DRAM as described in A. Bellaouar and M. Elmasry, "Low power digital VLSI design—circuits and systems", Kiuwer Academic, Chapter 6, section 6,2.13.1, p. 381–383, 1995, and shown in FIGS. 1a and 1b is well known in the art. The pass transistor $M_p$ and the cell capacitor $C_c$ form the memory cells 100. The gates of the pass transistors $M_p$ are connected to the word lines $WL_1$ 115a, $WL_2$ 115b, $WL_3$ 115c, $WL_{n-2}$ 115d, $WL_{n-1}$ 115e, and $WL_n$ 115f. The sources of the pass transistors $M_p$ are connected to the primary and complementary bit lines BL 105 and $\overline{BL}$ 110. When the word line $WL_1$ 115a, $WL_2$ 115b, $WL_3$ 115c, $WL_{n-2}$ 115d, $WL_{n-1}$ 115e, or $WL_n$ 115f is brought to a voltage level $V_h$ that is higher than the power supply voltage source $V_{cc}$ by at least one threshold voltage $V_T$ of the pass transistor $M_p$, the pass transistor $M_p$ will be turned on to allow the charging and discharging of the cell capacitance $C_c$ without a voltage drop that is the threshold voltage $V_T$ of the pass transistor $M_p$.

The metal oxide semiconductor (MOS) transistors $M_3$ and $M_4$ form the negative sense amplifier 125a and the MOS transistors $M_5$ and $M_6$ form the positive sense amplifier 125b. The negative sense amplifier voltage source 127 and the positive sense amplifier voltage source 129 provide the necessary voltage to latch the negative sense amplifier 125a and the positive sense amplifier 125b.

The MOS transistors $M_7$, $M_8$, and $M_9$ form the pre-charge and equalization circuit 130. The gates of the MOS transistors $M_7$, $M_8$, and $M_9$ are connected to the pre-charge and equalization control voltage source 132. The drains of the MOS transistors $M_7$ and $M_8$ are connected to the reference voltage source $V_{cc}/2$ 135. The sources of the MOS transistors $M_7$ and $M_8$ are connected respectively to the primary and complementary bit lines BL 105 and $\overline{BL}$ 110.

When the pre-charge and equalization control voltage source 132 is brought to a level sufficient to turn on the MOS transistors $M_7$, $M_8$, and $M_9$, the primary and complementary bit lines BL 105 and $\overline{BL}$ 110 are pre-charged to the voltage level that is one half the voltage level of the power supply voltage source ($V_{cc}/2$), and the MOS transistor $M_9$ will equalize any voltage difference between the primary and complementary bit lines BL 105 and $\overline{BL}$ 110. The pre-charging operation is the charging of the distributed capacitance of each of the primary and complementary bit lines BL 105 and $\overline{BL}$ 110 as represented by the capacitors $CBL_{1a}$ 107, $CBL_{1b}$ 108, $CBL_{2a}$ 112, $CBL_{2b}$ 113.

The MOS transistors $M_1$, $M_2$, $M_{10}$, and $M_{11}$ form the isolation circuits 120a and 120b that divide the primary and complementary bit lines BL 105 and $\overline{BL}$ 110 into segments so as to isolate the memory cells 100 from the negative and positive sense amplifiers 125a and 125b and the pre-charge and equalization circuit 130. The isolation control voltage source 122a is attached to the gates of the MOS transistors $M_1$ and $M_2$. The isolation control voltage source 122b is attached to the gates of the MOS transistors $M_{10}$ and $M_{11}$.

The isolation control voltage source 122 will turn on or turn off the MOS transistors $M_1$, $M_2$, $M_{10}$, and $M_{11}$ selectively to connect the memory cells 100 to the negative and positive sense amplifiers 125a and 125b and the pre-charge and equalization circuit 130. The switches $S_1$, $S_2$, $S_3$, and $S_4$ are single pole single throw switches that are formed respectively by the MOS transistors $M_1$, $M_2$, $M_{10}$, and $M_{11}$.

FIG. 2 shows multiple rows of the DRAM cells as arranged in FIGS. 1a and 1b. The read operation begins by the isolation control voltage source 122a activating the switches $S_1$ and $S_2$ in the isolation circuit 120a to couple the segment of the primary and complementary bit lines BL 105 and $\overline{BL}$ 110 connected to the sub-array of DRAM cells 150. The isolation control voltage source 122b will maintain the switches $S_3$ and $S_4$ of the isolation circuit 120b open to isolate the segment of the primary and complementary bit lines BL 105 and $\overline{BL}$ 110 connected to the sub-array of DRAM cells 155 of the DRAM cells.

The equalization circuit 130 will be activated as described above to pre-charge the bit line capacitances 107 and 112 and equalize any voltage difference between the primary and complementary bit lines BL 105 and $\overline{BL}$ 110.

A word line attached to the DRAM cells 100 that are to be read is activated. For instance, if the DRAM cells 100 attached to word line WL3 115c are to be read, the word line WL3 115c will be brought to a voltage level $V_h$ that is greater than the power supply voltage source. The voltage level $V_h$ will activate the pass transistor $M_p$ of the DRAM cells 100 of FIGS. 1a and 1b. The charge present on the cell capacitor $C_c$ of the DRAM cell 100 of FIGS. 1a and 1b will flow to or from the primary bit line BL 105.

The latching sense amplifier 125 will be activated to sense the change in voltage on the primary bit line BL 105 due to the selection of the DRAM cell 100 on the word line WL3 115c. The latching sense amplifier 125 will drive the primary bit line BL 105 to either the voltage level of the power supply voltage source $V_{cc}$ or the voltage level of the ground reference point (GND). The level of the primary bit line BL 105 is dependent upon the level of charge present on the cell capacitor $C_c$ of the DRAM cell 100. The latching sense amplifier 125 further will drive the complementary bit line $\overline{BL}$ 110 to either the voltage level of the power supply voltage source $V_{cc}$ or the voltage level of the ground reference point (GND) that is opposite that of the primary bit line BL 105.

This forcing both primary and complementary bit lines BL 105 and $\overline{BL}$ 110 to the voltage level difference between the voltage level of the power supply voltage source $V_{cc}$ and the voltage level of the ground reference point GND is a well known source of noise, as is described in M. Aoki, et al., "A 60 ns 16 Mb CMOS DRAM with a transposed data-line structure", IEEE Trans. Solid-state Circuits, SC-23, No.5, p. 1113, 1988. As semiconductor processing technology has improved, the size of the DRAM cell 100 has been decreasing. This has increased the impact of the capacitively coupling noise between the bit-lines BL 105 and $\overline{BL}$ 110 to a point that it is becoming a serious source of data errors.

U.S. Pat. No. 5,276,641 (Sprogis et al) describes an open/folded bit line sense amplifier arrangement and accompanying circuit for a DRAM array. The basic structure consists of two memory arrays, each with a plurality of memory cells. These memory arrays employ a special cell layout architecture in which each cell shares only one passing word line with an adjacent cell. The memory cells are interconnected by bit lines which are parallel to each other and word line which are perpendicular to the bit lines.

Between the two memory arrays, arranged in a column, is a set of open sense amplifiers. Each open sense amplifier has a connector on either side for respectively accessing each of the two memory arrays. One of the connectors multiplexed to preferably three adjacent bit lines of one array while the other connector is multiplexed to preferably three adjacent bit lines of the opposite array. On the outer side of each memory array at the opposite ends of the bit lines is a set of folded bit line sense amplifiers, each having two connectors which are multiplexed to preferably three adjacent bit lines in the array one of the bit lines being common to each of these connectors. When data is to be input or output from the memory cells in an array, a word line is activated. In such a selected array, the connectors of each of the folded bit line sense amplifiers are connected by the multiplexing circuitry to one bit line in that array. An intervening bit line separates the two bit lines to which they are connected. Simultaneously, the connectors of an open bit line sense amplifier are activated, on being connected to a bit line in the selected array and the other being connected to a bit line in the unselected array, the later being surrounded on either side by bit lines clamped to AC ground, thus balancing the open sense amplifier capacitively and thereby greatly reducing noise.

U.S. Pat. No. 5,625,585 (Ahn et al.) describes a bit line structure that has low power consumption. The bit line structure will allow reduced chip operating current without expanding the layout area. Further the sensing noise between bit lines can be reduced compared with the conventional methods.

The bit line structure has a plurality of sense amplifiers each connected to two pairs of bit lines BL and /BL through bit line selecting switches. A plurality of memory cells are connected to the bit lines BL and IBL. A first bit line pair BL and /BL and a second bit line pair BL and /BL are formed by dividing a bit line disposed within a same line respectively in a cell array. A first connecting bit line will connect the bit line BL of said second bit line pair to the sense amplifier, and a second connecting bit line will connect the bit line /BL of the second bit line pair to the sense amplifier. The second connecting bit line will have two crossing sections crossing with another second connecting bit line for connecting a bit line BL of a second bit line belonging to an adjacent sense amplifier. The bit line selecting switches connect the first bit line pair and the second bit line pair respectively to the sense amplifier. The number of memory cells connected to each bit line is reduced to ½ compared with the conventional technique. The bit lines are arranged 3-dimensionally to eliminate the area loss in carrying out the layout, and particularly, the connecting bit lines are made of a conductive material, which has a smaller resistance than a conductive material of the bit lines.

The second connecting bit line passes over the first bit line of the bit line BL of another sense amplifier, and among the two crossing points one of them is located between the sense amplifier and the bit line selecting switch. The first and second connecting bit lines are composed of a material different from that of the first and second bit lines.

U.S. Pat. No. 5,010,523 (Yamauchi) discloses a sensing circuit for a DRAM. The bit lines of the DRAM array that are the reference side are temporarily connected to a large load capacitance or to a pre-charge power source when a read operation is performed. This will prevent change in electric potential of the bit lines at the reference side occurring due to interference noises between the bit lines from effecting a read operation. Connecting the reference side of the bit lines to the large load capacitance or to the pre-charge power source will further prevent deterioration of a signal-to-noise ratio due to the change in electric potential of the bit lines.

SUMMARY OF THE INVENTION

An object of this invention is provide a voltage limiting isolation circuit for primary and complementary bit lines within a DRAM array.

Another object of this invention is to reduce noise coupling between adjacent bit lines by limiting the voltage swing on the primary and complementary bit lines within a DRAM array.

Further another object of this invention is to provide a voltage limiting isolation circuit that will provide a full swing of the voltage on the primary and complementary bit lines to restore and write digital data to a DRAM cell within a DRAM array.

To accomplish these and other objects a voltage limiting bit line isolation circuit will selectively connect and disconnect a first portion of a primary bit line and a first portion of a complementary bit line from a second portion of the primary bit line and a second portion of the complementary bit line. The first portion of the primary bit line and the first portion of the complementary bit line will each have a plurality of DRAM cells attached. A latching sense amplifier and pre-charge and equalization circuit is connected between the second portion of the primary bit line and the second portion of the complementary bit line. The voltage limiting bit line isolation circuit has a first MOS transistor of a first conductivity type. The first MOS transistor of the first conductivity type has a drain connected to the first portion of the primary bit line, a gate connected to a first isolation control circuit. The first isolation control circuit will provide a first activation control voltage level that is sufficient to turn on said first MOS transistor of the first conductivity type.

The voltage limiting bit line isolation circuit, further, has a second MOS transistor of a first conductivity type. The second MOS transistor of the first conductivity type has a drain connected to the first portion of the complementary bit line, a gate connected to the first isolation control circuit. The first isolation control circuit will provide the first activation control voltage level that is sufficient to turn on said second MOS transistor of the first conductivity type.

The voltage limiting bit line isolation circuit, additionally, has a first MOS transistor of a second conductivity type. The first MOS transistor of the second conductivity type has a drain connected to the second portion of the primary bit line, a gate connected to a second isolation control circuit. The second isolation control circuit will provide a second activation control voltage level that is sufficient to turn on said first MOS transistor of the second conductivity type.

The voltage limiting bit line isolation circuit, also, has a second MOS transistor of a second conductivity type. The second MOS transistor of the second conductivity type has a drain connected to the second portion of the complementary bit line, a gate connected to the second isolation control circuit. The first isolation control circuit will provide the second activation control voltage level that is sufficient to turn on said second MOS transistor of the second conductivity type.

The sources of the first MOS transistors of the first and second conductivity types are connected together, as are the sources of the second MOS transistors of the first and second conductivity types.

During a read cycle the latching sense amplifier will sense and amplify the charge from a selected cell of the plurality of DRAM cells. The latching sense amplifier will begin to force the first and second portions of the primary and complementary bit lines to a voltage level that is either that of the power supply voltage source or the ground. As the voltage level of the first and second portions of the primary and complementary bit lines approaches to within one threshold voltage level of the MOS transistors, either the first MOS transistor of the first conductivity type or the first MOS transistor of the second conductivity type and the second MOS transistor of the first conductivity type or the second MOS transistor of the second conductivity type will turn off. The first portions of the primary and the complementary bit lines will be now isolated from the second portions of the primary and complementary bit lines. The first portions of the primary and complementary bit lines will have swing to a lower voltage level thus lowering coupled noise to adjacent bit lines.

To provide a full charging level to the selected DRAM cell of the plurality of DRAM cells, the voltage limiting bit line isolation circuit further has a third MOS transistor of the first conductivity type. The source of the third MOS transistor of the first conductivity type has a source connected to the second portion of the primary bit line, a drain connected to the first portion of the primary bit line, and a gate connected to a third isolation control circuit. The third isolation control circuit will provide a third activation voltage that will turn on said third MOS transistor of the first conductivity type during a write time and a restore time of the selected DRAM cell attached to said first portion of said primary bit line. The third activation voltage will be sufficiently high to allow the first portion of the primary bit line to achieve the full charging level.

The voltage limiting isolation circuit will also have a fourth MOS transistor of the first conductivity type. The fourth MOS transistor of the first conductivity type has a source connected to the second portion of the complementary bit line, a drain connected to the first portion of the complementary bit line, and a gate connected to the third isolation control circuit. The third isolation control circuit will provide a fourth activation voltage that will turn on said fourth MOS transistor of the first conductivity type during a write time and a restore time of the selected DRAM cell attached to said first portion of said complementary bit line. The fourth activation voltage will be sufficiently high to allow the first portion of the primary bit line to achieve the full charging level.

BRIEF DESCRIPTION OF THE DRAWINGS

FIGS. 1a and 1b are schematic drawings of a row of DRAM cells of a DRAM array showing the isolation circuitry of the prior art.

FIG. 2 is a schematic drawing of a DRAM array of the prior art.

DETAILED DESCRIPTION OF THE INVENTION

Figure 3:
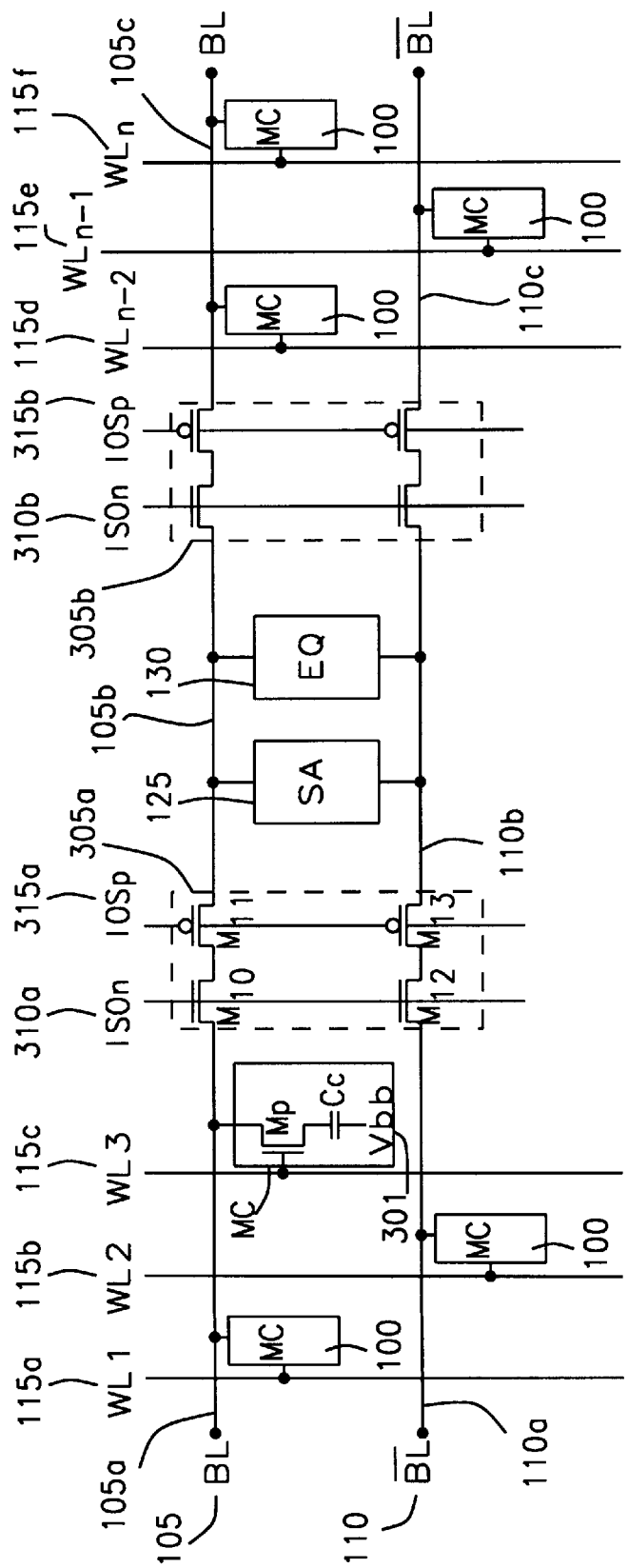
FIG. 3 is a schematic drawings of a row of DRAM cells of a DRAM array showing the first embodiment of the voltage limiting isolation circuit of this invention.

Refer now to FIG. 3 to understand the structure of a row of DRAM cells employing the voltage limiting isolation circuit of this invention. The structure of the DRAM cells 100 is as above described for FIGS. 1a and 1b. The primary and complementary bit lines BL 105 and $\overline{BL}$ 110 and the word lines $WL_1$ 115a, $WL_2$ 115b, $WL_3$ 115c, $WL_{n-2}$ 115d, $WL_{n-1}$ 115e, and $WL_n$ 115f are connected to the DRAM cells 100 as described above in FIGS. 1a and 1b. Additionally, the latching sense amplifier 125 and the pre-charge and equalization circuit 130 are connected between the primary and complementary bit lines BL 105 and $\overline{BL}$ 110 and function as above described in FIGS. 1a and 1b.

The voltage limiting isolation circuits 305a and 305b replace the isolation circuit 120 of FIGS. 1a and 1b. The below description will be for the voltage limiting isolation circuit 305a, however, the voltage limiting isolation circuit 305b will be as described for the voltage limiting isolation circuit 305a. The N-type MOS transis5tors $M_{10}$ and the P-type MOS transistor $M_{11}$ are connected to the primary bit line BL 105 to divide the primary bit lines BL 105 into the portion 105a to isolate the DRAM cells 100 from the portion of the primary bit line 105b attached to the latching sense amplifiers 125 and the pre-charge and equalization circuit 130. The drain of the N-type MOS transistor $M_{10}$ is connected to the portion of the primary bit line 105a and the drain of the P-type MOS transistor $M_{11}$ s connected to the portion of the primary bit line BL 105b. The sources of the N-type MOS transistors $M_{10}$ and the P-type MOS transistor $M_{11}$ are connected together. The gate of the N-type MOS transistors $M_{10}$ is connected to the isolation voltage control circuit $ISO_n$ 310a and the gate of the P-type MOS transistor $M_{11}$ is connected to the isolation voltage control circuit $ISO_p$ 315a.

The N-type MOS transistors $M_{12}$ and the P-type MOS transistor $M_{13}$ are connected to the complementary bit line $\overline{BL}$ 110 to divide the complementary bit line $\overline{BL}$ 110 into the portion 110a to isolate the DRAM cells 100 from the portion of the primary bit line 110b attached to the latching sense amplifiers 125 and the pre-charge and equalization circuit 130. The drain of the N-type MOS transistor $M_{12}$ is connected to the portion of the complementary bit line BL $\overline{BL}$ $\overline{BL}$ 110a and the drain of the P-type MOS transistor $M_{13}$ is connected to the portion of the complementary bit line $\overline{BL}$ 110b. The sources of the N-type MOS transistors $M_{11}$ and the P-type MOS transistor $M_{13}$ are connected together. The gate of the N-type MOS transistors $M_{12}$ is connected to the isolation voltage control circuit $ISO_n$ 310a and the gate of the P-type MOS transistor $M_{13}$ is connected to the isolation voltage control circuit $ISO_p$ 315a.

To read a selected DRAM cell 301, the isolation voltage control circuit $ISO_n$ 310a and the isolation voltage control circuit $ISO_p$ 315a will place a voltage at the respective gates of the N-type MOS transistors $M_{10}$ and $M_{12}$ and the P-type MOS transistors $M_{11}$ and $M_{13}$ sufficiently large so as turn on the N-type MOS transistors $M_{10}$ and $M_{12}$ and the P-type MOS transistors $M_{11}$ and $M_{13}$. Generally this voltage will be approximately the voltage level of the power supply voltage source $V_{cc}$ for the isolation voltage control circuit $ISO_n$ 310a and the voltage level of the ground GND for the isolation voltage control circuit $ISO_p$ 315a.

The pre-charge and equalization circuit 130 will be activated as above described to pre-charge and equalize the voltage level of the portions of the primary bit line BL 105a and 105b and the portions of the complementary bit line $\overline{BL}$ 110a and 110b to the reference voltage level $V_{cc}/2$. The pre-charge and equalization circuit 130 will be deactivated and the word line WL3 115c will be activated to turn on the pass transistor $M_p$ of the selected DRAM cell 301.

The charge level present on the cell capacitor $C_c$ of the selected DRAM cell 301 will flow to the portions of the primary bit line BL 105*a* and 105*b* to vary the voltage level present on the portions of the primary bit line BL 105*a* and 105*b* by approximately 100–200 mV.

The latching sense amplifier 125 will then be activated. Depending on the level of charge present on the cell capacitor $C_c$ of the selected DRAM cell 301, the latching sense amplifier will force the voltage level on the portions of the primary bit line BL 105*a* and 105*b* toward either the voltage level of the power supply voltage source $V_{cc}$ or the voltage level of the ground GND. The portions of the complementary bit line $\overline{BL}$ 110*a* and 110*b* are then forced toward the opposite voltage level of the portions of the primary bit line BL 105*a* and 105*b*. That is, if the portions of the primary bit line BL 105*a* and 105*b* are to be forced toward the voltage level of the power supply voltage source $V_{cc}$, the voltage level of the portions of the complementary bit line $\overline{BL}$ 110*a* and 110*b* will be forced toward the voltage level of the ground GND. Likewise, if the portions of the primary bit line BL 105*a* and 105*b* are to be forced toward the voltage level of the ground GND, the voltage level of the portions of the complementary bit line $\overline{BL}$ 110*a* and 110*b* will be forced toward the voltage level of the power supply voltage source $V_{cc}$.

As the voltages on the portions of the primary bit lines BL 105*a* and 105*b* or the portions of the complementary bit lines $\overline{BL}$ 110*a* and 110*b* approach the voltage level that is one threshold voltage level $V_t$ of the N-type MOS transistors $M_{10}$ or $M_{12}$ less than the power supply voltage source $V_{cc}$, the N-type MOS transistors $M_{10}$ or $M_{12}$ will turn off. Or as the voltages on the portions of the primary bit lines BL 105*a* and 105*b* or the portions of the complementary bit lines $\overline{BL}$ 110*a* and 110*b* approach the voltage level that is one threshold voltage level $V_t$ of the P-type MOS transistors $M_{11}$ or $M_{13}$ above the ground GND, the P-type MOS transistors $M_{11}$ or $M_{13}$ will turn off. By turning off either the N-10 type MOS transistors $M_{10}$ or the P-type MOS transistors $M_{11}$ on the portions of the primary bit lines BL 105*a* and 105*b* and turning off either the either the N-type MOS transistors $M_{12}$ or the P-type MOS transistors $M_{13}$ on the portions of the complementary bit lines $\overline{BL}$ 110*a* and 110*b*, the portions of the portions of the primary bit lines BL 105*a* and the complementary bit lines $\overline{BL}$ 110*a* will be isolated from the portions of the primary bit lines BL 105*b* and the complementary bit lines $\overline{BL}$ 110*b*. The latching sense amplifier will now have to drive only the portions of the primary bit lines BL 105*b* and the complementary bit lines $\overline{BL}$ 110*b* to the full voltage swing of the difference between the power supply voltage source $V_{cc}$ and the ground GND.

The portions of the primary bit lines BL 105*a* and the complementary bit lines $\overline{BL}$ 110*a* will be maintained at either the voltage level of the power supply $V_{cc}$ less the threshold voltage $V_t$ or the ground GND plus the threshold voltage $V_t$ during either restoration or writing of the digital data to the cell capacitor $C_c$ of the selected DRAM cell 301. In having DRAM cells having power supply voltage sources $V_{cc}$ of approximately 3.3 V, limiting the voltage level on the portions of the primary bit lines BL 105*a* and the complementary bit lines $\overline{BL}$ 110*a* to either the voltage level of the power supply $V_{cc}$ less the threshold voltage $V_t$ or the ground GND plus the threshold voltage $V_t$ will save approximately 50% in the charging and discharging power. Further, reducing the range of the voltage swing on the portions of the primary bit lines BL 105*a* and the complementary bit lines $\overline{BL}$ 110*a* will reduce the coupling of noise to adjacent inactive bit lines. This lower range of voltage swing will also reduce junction temperature within the DRAM array, provide longer refresh time for the DRAM array, and a faster sensing of the charge present on the cell capacitor $C_c$ of the selected DRAM cell 310.

The above described first embodiment of the voltage bit line isolation circuit has a drawback. The reduction of the voltage level on the portions of the primary bit lines BL 105*a* and the complementary bit lines $\overline{BL}$ 110*a* will not provide the necessary high level of charge to the cell capacitor $C_c$ during restoration or writing of the digital data. One solution is to have the isolation voltage control circuits $ISO_n$ 310*a* brought to the voltage level $V_h$, which will be greater than the power supply voltage source $V_{cc}$ plus the threshold voltage $V_t$ of the N-type MOS transistors $M_{10}$ and $M_{12}$. The isolation voltage control circuit $ISO_p$ 315*a* will be brought to the voltage level Of $-V_{bb}$, which is the level the substrate biasing voltage less the threshold voltage $V_t$ of the P-type MOS transistors $M_{11}$ and $M_{13}$. This will defeat the purpose of the limiting the voltage swing on the portions of the primary bit lines BL 105*a* and the complementary bit lines $\overline{BL}$ 110*a*.

Figure 4:
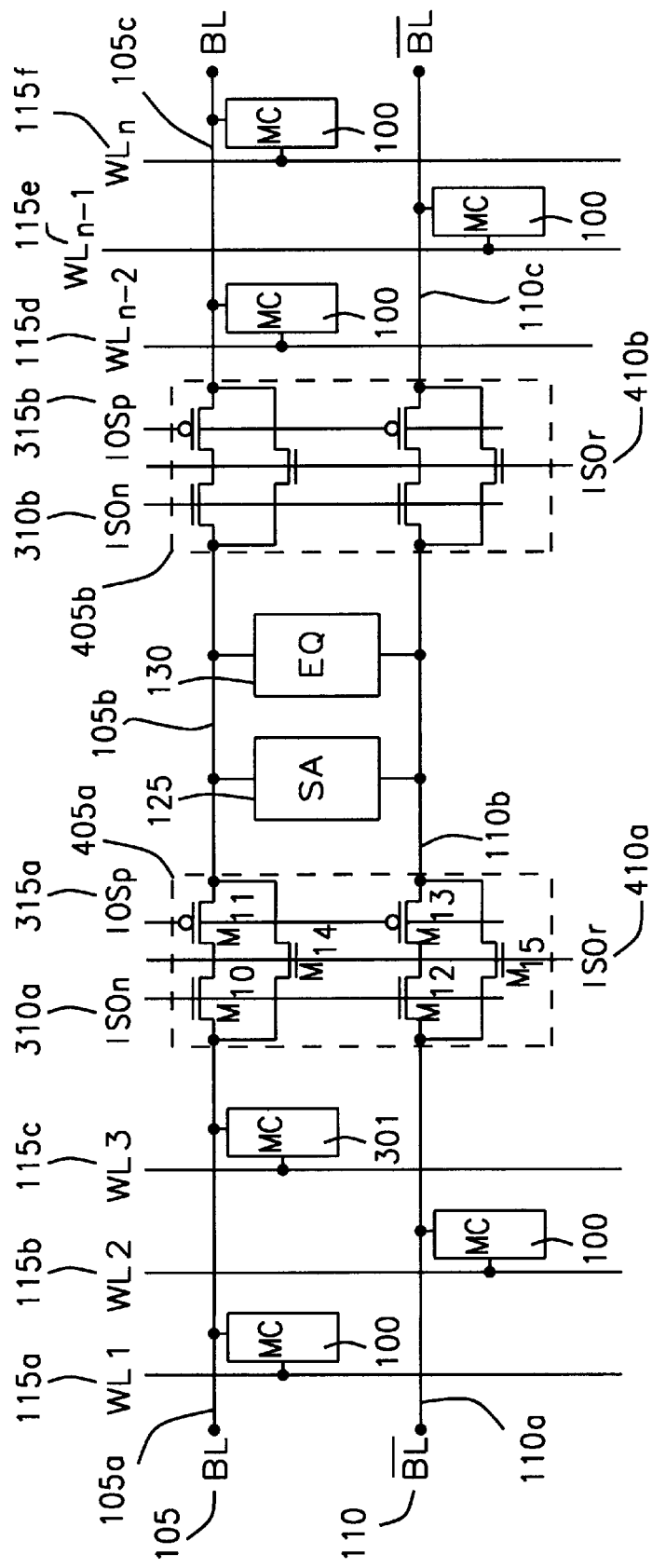
FIG. 4 is a schematic drawing of a row of DRAM of a DRAM array showing the second embodiment of the voltage limiting isolation circuit of this invention.

Refer now to FIG. 4 to discuss a second embodiment of a voltage limiting isolation circuit of this invention. The structure of the row of DRAM cells 100, having the primary bit lines BL 105 and the complementary bit lines $\overline{BL}$ 110 is as described above. The latching sense amplifier 125 and the pre-charge and equalization circuit 130 is also as above described. The voltage limiting isolation circuit has the N-type MOS transistors $M_{10}$ and $M_{12}$ and the P-type MOS transistors $M_{11}$ and $M_{13}$ is as described in FIG. 3. To overcome the problem of is the inadequate voltage level on the portions of the primary bit lines BL 105*a*, the N-type MOS transistor $M_{14}$ is connected between the portion of the primary bit lines BL 105*a* and the portion of the primary bit lines BL 105*b*. Further, to overcome the problem of the inadequate voltage level on the portions of the complementary bit lines $\overline{BL}$ 110*a*, the N-type MOS transistor $M_{15}$ is connected between the portions of the complementary bit lines $\overline{BL}$ 110*a* and the portions of the complementary bit lines $\overline{BL}$ 110*b*.

The drain of the N-type MOS transistor $M_{14}$ will be connected to the portion of the primary bit lines BL 105*a* and the source of the N-type MOS transistor $M_{14}$ will be connected to the portion of the primary bit lines BL 105*b*. The gate of the N-type MOS transistor $M_{14}$ will be connected to the write/restore voltage control circuit $ISO_r$ 410*a* to control the turning on and turning off of the N-type MOS transistor $M_{14}$.

The drain of the N-type MOS transistor $M_{15}$ will be connected to the portion of the complementary bit lines $\overline{BL}$ 110*a*, and the source of the N-type MOS transistor $M_{14}$ will be connected to the portion of the complementary bit lines $\overline{BL}$ 110*b*. The gate of the N-type MOS transistor $M_{15}$ will be connected to the write/restore voltage control circuit $ISO_r$ 410*a* to control the turning on and turning off of the N-type MOS transistor $M_{15}$.

During the read cycle the second embodiment of the voltage limiting bit line isolation circuit will operate as above described for the first embodiment, with the N-type MOS transistors $M_{14}$ and $M_{15}$ turned off. However, during the restore time period of a read cycle or during a write cycle, the write/restore voltage control circuit ISO410*a* will place the voltage level $V_h$ at the gates of the N-type MOS transistors $M_{14}$ and $M_{15}$. The N-type MOS transistors $M_{14}$ and $M_{15}$ will turn on allowing the portions of the primary bit lines BL 105*a* to be connected to the primary bit lines BL 105*b* and the portions of the complementary bit lines $\overline{BL}$ 110*a* to be connected to the portions of the complementary bit lines $\overline{BL}$ 110b. The primary bit lines BL 105a and the portions of the complementary bit lines $\overline{BL}$ 110a will then be forced by the latching sense amplifier 125 to the full voltage level of the either the power supply voltage source $V_{cc}$ or the substrate biasing voltage $V_{ss}$. This will allow the cell capacitor $C_c$ of the selected DRAM 310 to be charged to the full level of charge.

By limiting the swing of the voltage on the portions of the primary bit lines BL 105a and the portions of the complementary bit lines $\overline{BL}$ 110a the coupled noise from the active bit lines to the inactive bit lines will be minimized, while the charge level on the cell capacitor $C_c$ of the selected DRAM 301 will be charged to the full voltage level of the power supply voltage source $V_{cc}$ or the ground GND.

The structure and operation of the voltage limiting bit line isolation circuit 405b is identical as described for the voltage limiting bit line isolation circuits 405a.

While this invention has been particularly shown and described with reference to the preferred embodiments thereof, it will be understood by those skilled in the art that various changes in form and details may be made without departing from the spirit and scope of the invention.

The invention claimed is:

1. A voltage limiting bit line isolation circuit to selectively connect and disconnect a first portion of a primary bit line and a first portion of a complementary bit line, each having a plurality of DRAM cells attached, from a second portion of the primary bit line and a second portion of the complementary bit line, having a latching sense amplifier and pre-charge and equalization circuit connected between the second portion of the primary bit line and the second portion of the complementary bit line, whereby said voltage limiting bit line isolation circuit comprises:

a) a first MOS transistor of a first conductivity type having a drain connected to the first portion of the primary bit line, a gate connected to a first isolation control circuit, whereby said first isolation control circuit will provide a first activation control voltage level that is sufficient to turn on said first MOS transistor of the first conductivity type, and a source;

b) a second MOS transistor of the first conductivity type having a drain connected to the first portion of the complementary bit line, a gate connected to the first isolation control circuit, whereby said first isolation control circuit will provide a second activation control voltage level that is sufficient to turn on said second MOS transistor of the first conductivity type, and a source;

c) a first MOS transistor of a second conductivity type having a drain connected to the second portion of the primary bit line, a gate connected to a second isolation control circuit, whereby said second isolation control circuit will provide a third activation control voltage level sufficient to turn on said first MOS transistor of the second conductivity type, and a source connected to the source of the first MOS transistor of the first conductivity type; and d) a second MOS transistor of the second conductivity type having a drain connected to the first portion of the complementary bit line, a gate connected to the second isolation control circuit, whereby said second isolation control circuit will provide a fourth activation control voltage level that is sufficient to turn on said second MOS transistor of the second conductivity type, and a source connected to the source of the second MOS transistor of the first conductivity type.

2. The voltage limiting bit line isolation circuit of claim 1 further comprising:

a) a third MOS transistor of the first conductivity type having a source connected to the second portion of the primary bit line, a drain connected to the first portion of the primary bit line, and a gate connected to a third isolation control circuit, whereby said third isolation control circuit will provide a fifth activation voltage that will turn on said third MOS transistor of the first conductivity type during a write time and a restore time of a selected DRAM cell attached to said first portion of said primary bit line; and b) a fourth MOS transistor of the first conductivity type having a source connected to the second portion of the complementary bit line, a drain connected to the first portion of the complementary bit line, and a gate connected to the third isolation control circuit, whereby said third isolation control circuit will provide a sixth activation voltage that will turn on said fourth MOS transistor of the first conductivity type during a write time and a restore time of a selected DRAM cell attached to said first portion of said complementary bit line.

3. The voltage limiting bit line isolation circuit of claim 1 wherein the first activation control voltage level, the second activation control voltage level, the third activation control voltage level and the fourth activation control voltage level will each have voltage levels that are such that, as said latching sense amplifier approaches one threshold voltage from the first activation control voltage level, the second activation control voltage level, the third activation control voltage level and the fourth activation control voltage level, two of said first and second MOS transistor of the first conductivity type and the first and second MOS transistor of the second conductivity type will turn off to limit a voltage swing on said first portions of said primary and secondary bit lines.

4. The voltage limiting bit line isolation circuit of claim 2 wherein the first activation control voltage level, the second activation control voltage level, the third activation control voltage level and the fourth activation control voltage level will each have voltage levels that are such that, as said latching sense amplifier approaches one threshold voltage from the first activation control voltage level, the second activation control voltage level, the third activation control voltage level and the fourth activation control voltage level, two of said first and second MOS transistor of the first conductivity type and the first and second MOS transistor of the second conductivity type will turn off to limit a voltage swing on said first portions of said primary and secondary bit lines.

5. The voltage limiting bit line isolation circuit of claim 4 wherein the fifth and sixth activation levels will turn on the third and fourth MOS transistors of the first conductivity type during the write and restore times to allow the first portions of the primary and complementary bit lines to be driven to a voltage level present at the second portions of the primary and complementary bit lines to fully place a charge on said selected DRAM cell.

6. A voltage limiting bit line isolation circuit to selectively connect and disconnect a first portion of a primary bit line and a first portion of a complementary bit line, each having a plurality of DRAM cells attached, from a second portion of the primary bit line and a second portion of the complementary bit line, having a latching sense amplifier and pre-charge and equalization circuit connected between the second portion of the primary bit line and the second portion of the complementary bit line, whereby said voltage limiting bit line isolation circuit comprises:

a) a first MOS transistor of a first conductivity type having a drain connected to the first portion of the primary bit line, a gate connected to a first isolation control circuit, whereby said first isolation control circuit will provide a first activation control voltage level that is sufficient to turn on said first MOS transistor of the first conductivity type, and a source;

b) a second MOS transistor of the first conductivity type having a drain connected to the first portion of the complementary bit line, a gate connected to the first isolation control circuit, whereby said first isolation control circuit will provide a second activation control voltage level that is sufficient to turn on said second MOS transistor of the first conductivity type, and a source;

c) a first MOS transistor of a second conductivity type having a drain connected to the second portion of the primary bit line, a gate connected to a second isolation control circuit, whereby said second isolation control circuit will provide a third activation control voltage level sufficient to turn on said first MOS transistor of the second conductivity type, and a source connected to the source of the first MOS transistor of the first conductivity type;

d) a second MOS transistor of the second conductivity type having a drain connected to the first portion of the complementary bit line, a gate connected to the second isolation control circuit, whereby said second isolation control circuit will provide a fourth activation control voltage level that is sufficient to turn on said second MOS transistor of the second conductivity type, and a source connected to the source of the second MOS transistor of the first conductivity type;

e) a third MOS transistor of the first conductivity type having a source connected to the second portion of the primary bit line, a drain connected to the first portion of the primary bit line, and a gate connected to a third isolation control circuit, whereby said third isolation control circuit will provide a fifth activation voltage that will turn on said third MOS transistor of the first conductivity type during a write time and a restore time of a selected DRAM cell attached to said first portion of said primary bit line; and f) a fourth MOS transistor of the first conductivity type having a source connected to the second portion of the complementary bit line, a drain connected to the first portion of the complementary bit line, and a gate connected to the third isolation control circuit, whereby said third isolation control circuit will provide a sixth activation voltage that will turn on said fourth MOS transistor of the first conductivity type during a write time and a restore time of a selected DRAM cell attached to said first portion of said complementary bit line.

7. The voltage limiting bit line isolation circuit of claim 6 wherein the first activation control voltage level, the second activation control voltage level, the third activation control voltage level and the fourth activation control voltage level will each have voltage levels that are such that, as said latching sense amplifier approaches one threshold voltage from the first activation control voltage level, the second activation control voltage level, the third activation control voltage level and the fourth activation control voltage level, two of said first and second MOS transistor of the first conductivity type and the first and second MOS transistor of the second conductivity type will turn off to limit a voltage swing on said first portions of said primary and secondary bit lines.

8. The voltage limiting bit line isolation circuit of claim 6 wherein the fifth and sixth activation levels will turn on the third and fourth MOS transistors of the first conductivity type during the write and restore times to allow the first portions of the primary and complementary bit lines to be driven to a voltage level present at the second portions of the primary and complementary bit lines to fully place a charge on said selected DRAM cell.

9. A DRAM array to retain digital data comprising;

a) a plurality of DRAM cells arranged in a plurality of rows and columns;

b) a plurality of word lines, whereby each word line is connected to each column of DRAM cells;

c) a plurality of pairs of bit lines, whereby each pair of bit lines comprises a primary bit line and a complementary bit such that each pair of bit lines is connected to each row of DRAM cells;

d) a plurality of sense amplifiers, whereby each sense amplifier is connected between the primary and complementary bit lines of the pair of bit lines;

e) a plurality of pre-charge and equalization circuits, whereby each pre-charge and equalization circuit is connected between each pair of bit lines, to pre-charge the portions of the pair of bit lines to a voltage level that is a voltage level of a reference voltage source that is approximately one half a voltage level of one half a power supply voltage source and to equalize any voltage variation between the portions of the pair of bit lines being pre-charged; and f) A voltage limiting bit line isolation circuit to selectively connect and disconnect a first portion of a primary bit line and a first portion of a complementary bit line, each having a plurality of DRAM cells attached, from a second portion of the primary bit line and a second portion of the complementary bit line, having a latching sense amplifier and pre-charge and equalization circuit connected between the second portion of the primary bit line and the second portion of the complementary bit line, whereby said voltage limiting bit line isolation circuit comprises:

a first MOS transistor of a first conductivity type having a drain connected to the first portion of the primary bit line, a gate connected to a first isolation control circuit, whereby said first isolation control circuit will provide a first activation control voltage level that is sufficient to turn on said first MOS transistor of the first conductivity type, and a source;

a second MOS transistor of the first conductivity type having a drain connected to the first portion of the complementary bit line, a gate connected to the first isolation control circuit, whereby said first isolation control circuit will provide a second activation control voltage level that is sufficient to turn on said second MOS transistor of the first conductivity type, and a source;

a first MOS transistor of a second conductivity type having a drain connected to the second portion of the primary bit line, a gate connected to a second isolation control circuit, whereby said second isolation control circuit vw/ill provide a third activation control voltage level sufficient to turn on said first MOS transistor of the second conductivity type, and a source connected to the source of the first MOS transistor of the first conductivity type; and a second MOS transistor of the second conductivity type having a drain connected to the first portion of the complementary bit line, a gate connected to the second isolation control circuit, whereby said second isolation control circuit will provide a fourth activation control voltage level that is sufficient to turn on said second MOS transistor of the second conductivity type, and a source connected to the source of the second MOS transistor of the first conductivity type.

10. The DRAM array of claim 9 wherein the voltage limiting bit line isolation circuit further comprises:

a) a third MOS transistor of the first conductivity type having a source connected to the second portion of the primary bit line, a drain connected to the first portion of the primary bit line, and a gate connected to a third isolation control circuit, whereby said third isolation control circuit will provide a fifth activation voltage that will turn on said third MOS transistor of the first conductivity type during a write time and a restore time of a selected DRAM cell attached to said first portion of said primary bit line, and b) a fourth MOS transistor of the first conductivity type having a source connected to the second portion of the complementary bit line, a drain connected to the first portion of the complementary bit line, and a gate connected to the third isolation control circuit, whereby said third isolation control circuit will provide a sixth activation voltage that will turn on said fourth MOS transistor of the first conductivity type during a write time and a restore time of a selected DRAM cell attached to said first portion of said complementary bit line.

11. The DRAM array of claim 9 wherein the first activation control voltage level and the second activation control voltage level will each have voltage levels that are such that, as said latching sense amplifier approaches one threshold voltage from said first activation control voltage level and the second activation control voltage level, two of said first and second MOS transistor of the first conductivity type and the first and second MOS transistor of the second conductivity type will turn off to limit a voltage swing on said first portions of said primary and secondary bit lines.

12. The DRAM array of claim 10 wherein the first activation control voltage level, the second activation control voltage level, the third activation control voltage level and the fourth activation control voltage level will each have voltage levels that are such that, as said latching sense amplifier approaches one threshold voltage from the first activation control voltage level, the second activation control voltage level, the third activation control voltage level and the fourth activation control voltage level, two of said first and second MOS transistor of the first conductivity type and the first and second MOS transistor of the second conductivity type will turn off to limit a voltage swing on said first portions of said primary and secondary bit lines.

13. The DRAM array of claim 12 wherein the fifth and sixth activation levels will turn on the third and fourth MOS transistors of the first conductivity type during the write and restore times to allow the first portions of the primary and complementary bit lines to be driven to a voltage level present at the second portions of the primary and complementary bit lines to fully place a charge on said selected DRAM cell.

* * * * *